US008575708B2

(12) United States Patent
Lin (10) Patent No.: US 8,575,708 B2
(45) Date of Patent: Nov. 5, 2013

(54) STRUCTURE OF FIELD EFFECT TRANSISTOR WITH FIN STRUCTURE (75) Inventor: Chien-Ting Lin, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 33 days.

(21) Appl. No.: 13/281,448

(22) Filed: Oct. 26, 2011

(65) Prior Publication Data

US 2013/0105914 A1 May 2, 2013

(51) Int. Cl.
H01L 29/02 (2006.01)

(52) U.S. Cl.
USPC .......................................... 257/402; 257/327

(58) Field of Classification Search
USPC .................................................. 257/402, 327
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,101,763 B1 | 9/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,332,386 B2 * | 2/2008 | Lee et al. ...................... 438/197 |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Shaheen | |
| 7,781,810 B1 * | 8/2010 | An et al. ........................ 257/288 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0004107 A1 * | 1/2007 | Lee et al. ...................... 438/157 |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |

* cited by examiner

Primary Examiner — Douglas Menz
(74) Attorney, Agent, or Firm — Winston Hsu; Scott Margo (57) ABSTRACT A method for fabricating a field effect transistor with fin structure includes the following steps. A substrate having an ion well with a first conductivity type is provided, wherein the ion well has a first doping concentration. At least a fin structure disposed on the substrate is formed. At least a first ion implantation is performed to form an anti-punch doped region with first conductivity type between the substrate and the channel layer, wherein the anti-punch doped region has a third doping concentration higher than the first doping concentration. At least a channel layer disposed along at least one surface of the fin structure is formed after the first ion implantation is performed. A gate covering part of the fin structure is formed. A source and a drain disposed in the fin structure beside the gate are formed, wherein the source and the drain have a second conductivity type.

4 Claims, 6 Drawing Sheets

STRUCTURE OF FIELD EFFECT TRANSISTOR WITH FIN STRUCTURE

BACKGROUND OF THE INVENTION

1. Field of the Invention

The present invention generally relates to the field of field effect transistors (FETs) with fin structure. More particularly, the present invention relates to the structure of a field effect transistor with fin structure and fabricating method thereof.

2. Description of the Prior Art

With the trend in the industry being towards scaling down the size of metal oxide semiconductor transistors (MOS), three-dimensional or non-planar transistor technology, such as fin field effect transistor technology (Fin FET) has been developed to replace planar MOS transistors. The three-dimensional structure of a fin FET increases the overlapping area between the gate and the fin structure of the silicon substrate, and accordingly, the channel region is more effectively controlled. The drain-induced barrier lowering (DIBL) effect and short channel effect is therefore reduced. The channel region is also longer under the same gate length, and thus the current between the source and the drain is increased. In addition, threshold voltage of the fin FET can further be controlled by adjusting the work function of the gate.

In a conventional three-dimensional structure of the FET with fin structure, after the formation of a fin structure, an anti-punch ion implantation process is carried out to prevent the occurrence of a punch-through effect between source/drain or in a substrate. In a case that the top surface of the fin structure is covered by a patterned mask layer, however, exposed sidewalls of the fin structure are easily contaminated during the performance of the anti-punch ion implantation process. Because a channel layer is always disposed near the surface of the fin structure, the above mentioned contamination would affect the doping concentration in the channel layer and further increase the variation of carrier mobility in the channel layer.

In order to overcome the above-mentioned drawbacks, there is a need to provide a novel method for fabricating a FET which can avoid the contamination of the channel layer and therefore improve the electrical consistency among each FETs.

SUMMARY OF THE INVENTION

To address these and other objectives, the present invention provides a method for fabricating a field effect transistor with fin structure. A substrate having an ion well with a first conductivity type is provided, wherein the ion well has a first doping concentration. At least a fin structure disposed on the substrate is formed. At least a first ion implantation is performed to form an anti-punch doped region with first conductivity type between the substrate and the channel layer, wherein the anti-punch doped region has a third doping concentration higher than the first doping concentration. At least a channel layer disposed along at least one surface of the fin structure is formed after the first ion implantation is performed. A gate covering part of the fin structure is formed. A source and a drain disposed in the fin structure beside the gate are formed, wherein the source and the drain have a second conductivity type.

In another aspect, the present invention provides a structure of a field effect transistor with fin structure. A substrate has an ion well with a first conductivity type, wherein the ion well has a first doping concentration. At least a fin structure is disposed on the substrate. At least a channel layer is disposed along the surface of the fin structure, wherein the channel layer has a second doping concentration lighter than the first doping concentration. At least an anti-punch doped region with the first conductivity type is disposed between the substrate and the channel layer, wherein anti-punch doped region has a third doping concentration heavier than the first doping concentration. A gate covers part of the fin structure. A source and a drain are disposed in the fin structure beside the gate, wherein the source and the drain have a second conductivity type.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale, and some dimensions are exaggerated in the figures for clarity of presentation. Also, where multiple embodiments are disclosed and described as having some features in common, like or similar features will usually be described with like reference numerals for ease of illustration and description thereof.

Figure 1:
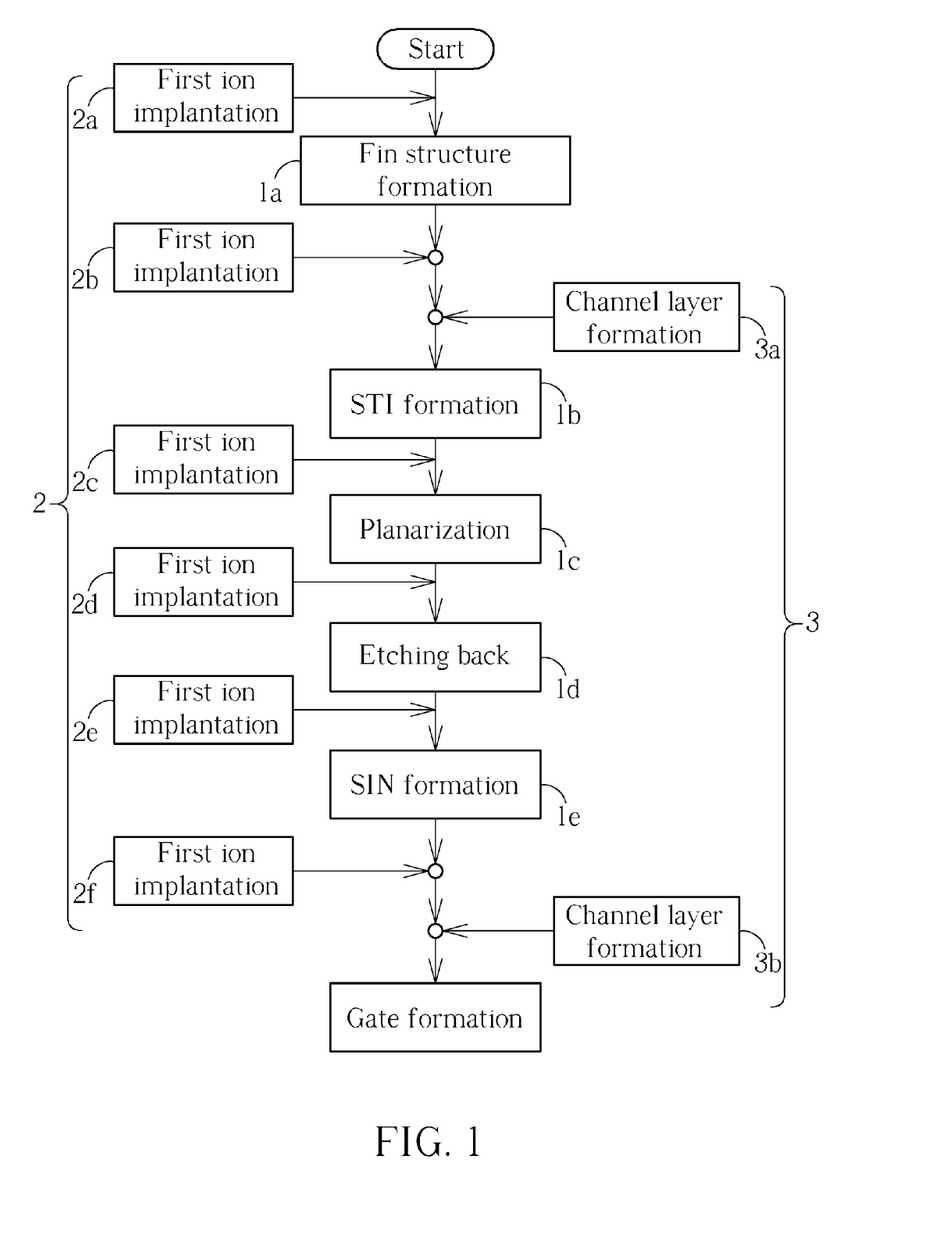
FIG. 1 is a flow chart illustrated a process for fabricating a field effect transistor with fin structure according to embodiments of the invention.

FIG. 1 is a flow chart illustrated a process for fabricating a field effect transistor with fin structure according to different embodiments of the invention. The fabrication method includes the following steps: fin structure formation 1a, shallow trench insulation (STI) formation 1b, planarization 1c, etching back 1d, SIN formation 1e. The above-mentioned steps are carried out sequentially and further include a first ion implantation 2 and a channel layer formation 3 process. The first ion implantation 3 is used to form an anti-punch doped region, which prevent the occurrence of a punch-through effect between source/drain or in a substrate. It is worth noting that, according to the technical feature of the present invention, the time of forming the channel layer 3 must be earlier than that of performing the first ion implantation 2. For example, when the moment of performing a first ion implantation 2 is at that of performing a first ion implantation 2a, 2b, 2c, 2d, 2e, 2f, the time of forming a channel layer 3 is preferred to be at the moment of forming a channel layer 3b. According to another embodiment, however, when the time of performing a first ion implantation 2 is at that of performing a first ion implantation 2a, 2b, the time of channel layer formation 3 is preferred to be at that of channel layer formation 3a. In order to provide a further understanding of the invention, several exemplary embodiments are described as follows:

The First Exemplary Embodiment

Figure 2:
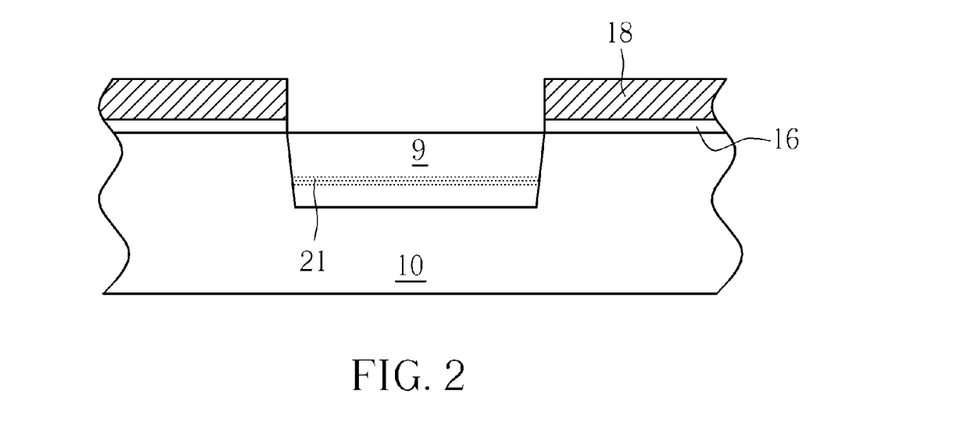
FIGS. 2-12 are schematic, cross-sectional view diagrams showing a method for fabricating a field effect transistor with fin structure according to the invention.

As illustrated in FIGS. 1-8, FIGS. 2-8 are schematic, cross-sectional view diagrams showing a method for fabricating a field effect transistor with fin structure according to the invention. In the first exemplary embodiment, the moment of performing the first ion implantation 2 is earlier than that of the fin structure forming 1a. As shown in FIG. 2, a substrate 10 covered with a patterned photoresist layer 18 is provided, wherein the patterned photoresist layer 18 is used to define the positions of an anti-punch doped region 21 and an ion well 9, that is to say, the anti-punch doped region 21 and the ion well 9 may be formed by using the same photomask. However, according to another embodiment, the ion well 9 and the anti-punch doped region 21 are fabricated by utilizing different photomasks. Next, an ion well 9 with a first conductivity type, e.g. P-type, is formed inside the substrate 10, wherein the ion well 9 has a first doping concentration, e.g. between $10^{12}$ to $10^{13}$ atoms/cm$^2$. In addition, another ion well (not shown) with a second conductivity type, e.g. N-type, may be formed inside the substrate 10. The positions of the ion wells described above correspond to an n-type metal oxide semiconductor transistor (NMOS) region (not shown) and a P-type metal oxide semiconductor transistor (PMOS) region (not shown), respectively. The substrate 10 may include a bulk silicon substrate or a silicon-on-insulator (SOI) substrate, wherein the SOI substrate is able to provide superior ground connection and thermal dissipation for reducing interference and cost.

Next, with the substrate 10 being covered with a patterned photoresist layer 18, a first ion implantation 2 is performed to form at least an anti-punch doped region 21 having a third doping concentration higher than the first doping concentration. It is should be noted that the first ion implantation 2 may include multiple steps ion implantation. In addition, according to this embodiment, an oxidation layer 16 may dispose on the surface of the substrate 10 to prevent severe damages resulting from direct ion bombardment during an ion implantation process.

Figure 3:
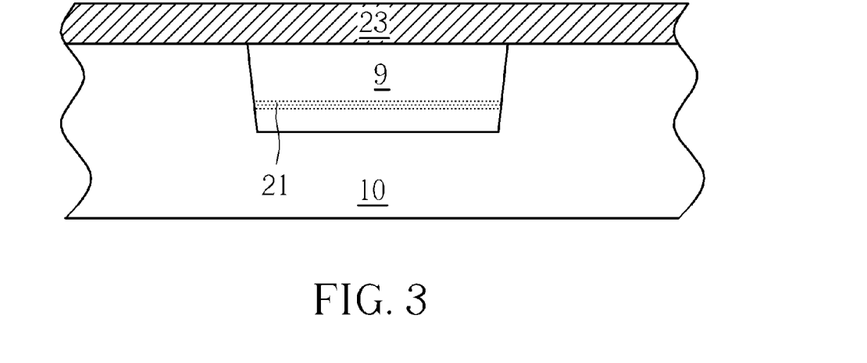

As shown in FIG. 3, the patterned photoresist layer 18 and the oxidation layer 16 are removed to expose the surface of the substrate 10 followed by optionally performing an epitaxial growth process to form a semiconductor layer 23 on the surface of the substrate 10. The semiconductor layer 23 may include silicon, silicon germanium, silicon carbide, a combination thereof, or other III-V compounds, but is not limited thereto. According to different requirements, the semiconductor layer 23 may be formed with suitable stress (tensile stress or compressive stress) or with preferable doping concentration to modulate the electrical property of channel layer.

Figure 4:
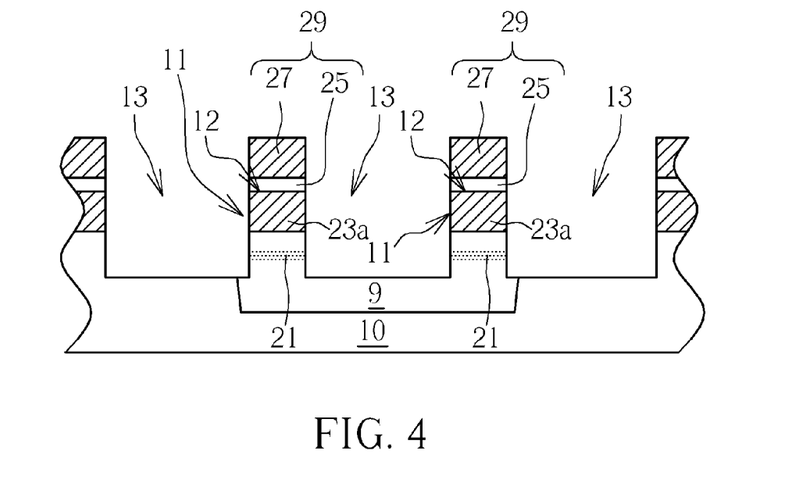

Next, as illustrated in FIG. 4, a second patterned mask layer 29 which includes at least a patterned buffer layer 25, e.g. silicon oxide, and at least a patterned hard mask layer 27, e.g. silicon nitride, is formed on the semiconductor layer 23. The purpose of the second patterned mask layer 29 is to define the position of each fin structure 11. An etching process is performed to form at least a fin structure 11 on the substrate 10 while each fin structures 11 is separated by a shallow trench 13. At this time, the top surface 12 of the patterned semiconductor layer 23a is covered by the second patterned mask layer 29 and the anti-punch doped region 21 is disposed below the patterned semiconductor layer 23a, wherein the distance between the top surface 12 and the anti-punch doped region 21 is preferably less than 400 angstrom.

Figure 5:
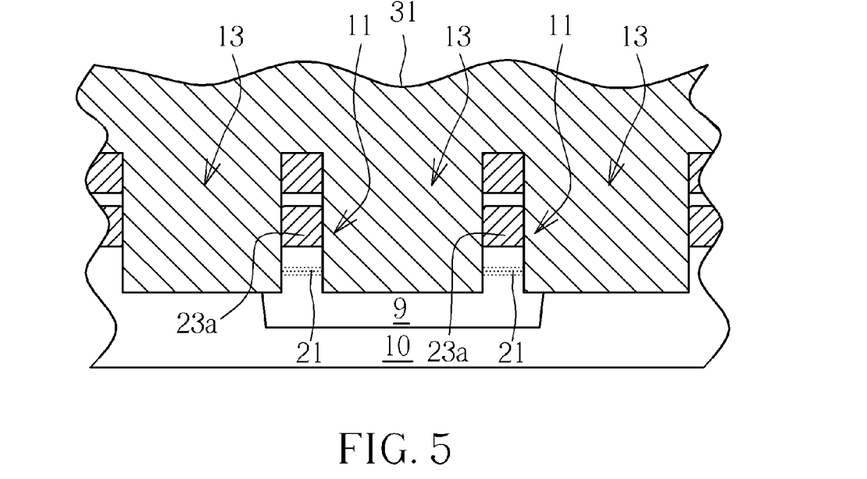
Figure 6:
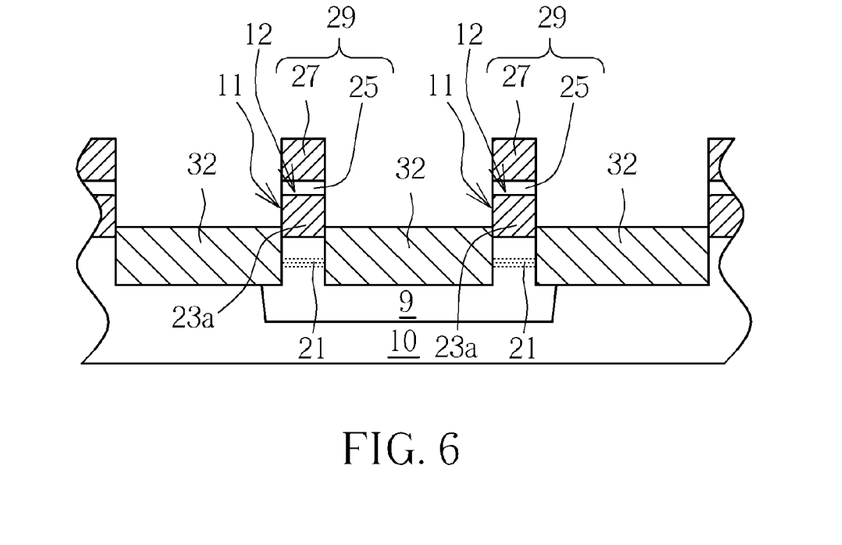

Subsequently, as illustrated in FIG. 5, through a high density plasma CVD (HPCVD) process, a sub atmosphere CVD (SACVD) process, or a spin on dielectric (SOD) process, an insulation layer 31 covering the fin structures 11 and filling the shallow trenches 13 is formed on the substrate 10. As shown in FIG. 6, a chemical mechanical polishing (CMP) process is performed to planarize the insulation layer 31, and an etching back process 1c is performed to remove a portion of the insulation layer 31 to form the shallow trench isolation 19 on the substrate 10 between each of the fin structures 11.

Figure 7:
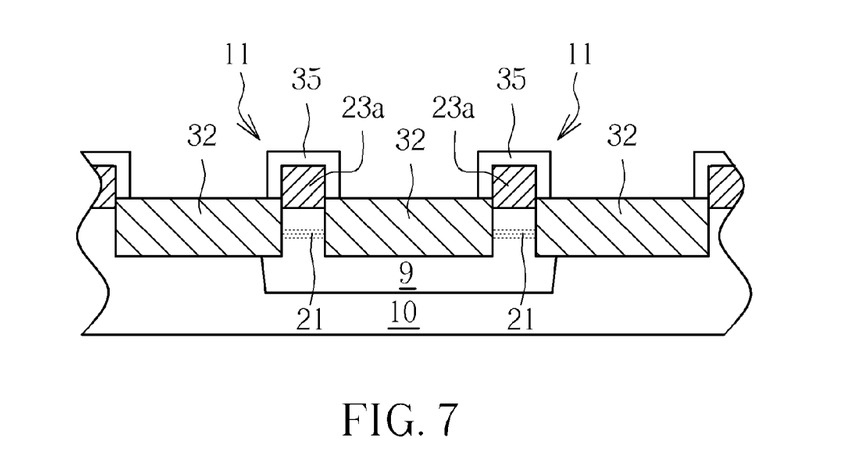

Please refer to FIG. 7. An etching process is performed to completely remove the second patterned mask layer 29. In one embodiment of the invention, when the composition of the second patterned mask layer 29 is silicon nitride, it can be removed by a conventional method, e.g. by hot phosphorous liquid. Next, by applying an epitaxial growth process, at least a channel layer 35 covering the surface of the fin structures 11 is formed. Optionally, a second ion implantation which includes a tilted-angle ion implantation may be performed to modulate the doping concentration of the channel layer 35 and further adjust the threshold voltage of transistors. The channel layer 35 includes silicon, silicon germanium, silicon carbide or another material that is suitable for acting as a carrier channel. It should be noted that, according to another embodiment of the invention, the channel layer 35 may be formed inside the fin structures 11 near the surface by an ion implantation. It is to say that, in this embodiment, the channel layer 35 does not cover the surface of the fin structures 11.

Figure 8:
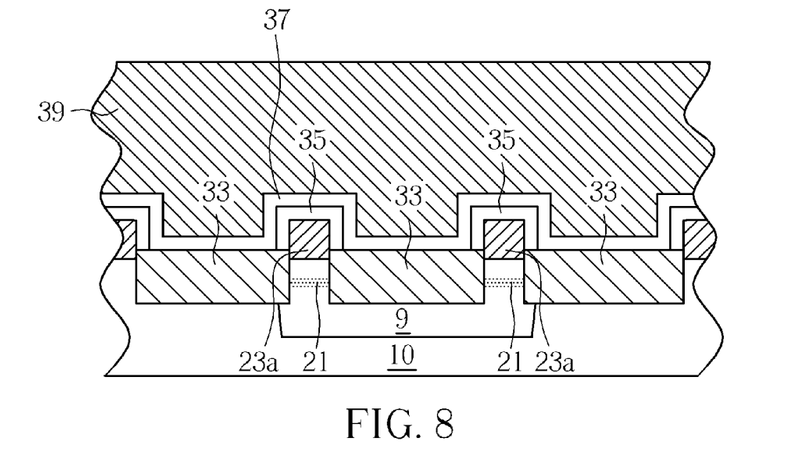

Next, as shown in FIG. 8, a dielectric layer 37 forming on the substrate 10 and a gate material layer 39 covering the fin structures 11 are formed sequentially. According to different requirements, the dielectric layer 37 may include silicon oxide (SiO), silicon nitride (SiN), or silicon oxynitride (SiON) while the gate material layer 39 may be made of polysilicon, silicate, or metal.

It should be noted that, in above said embodiment, the time of forming the channel layer 35 is later than that of filling the shallow trench 13 with the insulation layer 31. In another embodiment, however, the time of forming the channel layer 35 is just after formation of the fin structures 11. In this embodiment, at least the channel layer 35 covering the surface of the fin structures 11 is formed at a time interval between forming the fin structures 11 and filling the shallow trench 13 with insulation layer 31. At this time, the channel layer 35 is only formed on the sidewall of the fin structure 11 because the top surface 12 of the fin structure 11 is covered by the second patterned mask layer 29. Optionally, an additional second ion implantation may be performed to adjust the doping concentration of the channel layer 35 to a preferable value.

The Second Exemplary Embodiment

Please refer to FIG. 1 and FIGS. 3-8. The second exemplary embodiment is similar to the first exemplary embodiment and the main difference between them is that, in the second exemplary embodiment, the time of performing the first ion implantation 2 is at the time interval between fin structure formation 1a and STI formation 1b. Similar to FIG. 3, a substrate 10 covered with a semiconductor layer 23 is optionally provided and there is no anti-punch doped region in the substrate 10. Next, similar to FIG. 4, a second patterned mask layer 29 is formed on the semiconductor layer 23 to define the position of fin structure 11. By performing an etching process, at least a fin structure 11 is formed on the substrate 10 and is separated by a shallow trench 13. An etching process is performed to form at least a fin structure 11 on the substrate 10 while each fin structure 11 is separated by a shallow trench 13. Next, a first ion implantation 2 is carried out to form an anti-punch doped region 21 below the patterned semiconductor layer 23a. At this time, the top surface 12 of the patterned semiconductor layer 23a is covered by the second patterned mask layer 29 and the anti-punch doped region 21 is disposed below the patterned semiconductor layer 23a. According to another embodiment of the invention, if there is no semiconductor layer 23 covering the substrate 10 before formation of the fin structures 11, the anti-punch doped region 21 will be formed directly inside the fin structure 11. The remaining sequence is similar to FIGS. 5-8 according to the first exemplary embodiment. A detailed description is therefore omitted as this can be ascertained by referring to the previous paragraphs. In addition, similar to the first exemplary embodiment, the formation of the channel layer 35 may be performed in a time interval between performing the first ion implantation 2 and filling the shallow trench 13 with insulation layer 31.

The Third Exemplary Embodiment

Please refer to FIG. 1 and FIGS. 3-8. The third exemplary embodiment is similar to the second exemplary embodiment and the main difference between them is that, in the third exemplary embodiment, the time of performing the first ion implantation 2 is at the time interval between STI formation 1b and the planarization 1c process. Similar to FIG. 3, a substrate 10 covered with a semiconductor layer 23 is provided and there is no anti-punch doped region in the substrate 10. Next, similar to FIGS. 3-4, at least a fin structure 11 is formed on the substrate 10 and is separated by a shallow trench 13. An etching process is performed to form at least a fin structure 11 on the substrate 10 while each fin structure 11 is separated by a shallow trench 13. Subsequently, as illustrated in FIG. 5, through a high density plasma CVD (HPCVD) process, a sub atmosphere CVD (SACVD) process or a spin on dielectric (SOD) process, an insulation layer 31 covering the fin structures 11 and filling the shallow trenches 13 is formed on the substrate 10. Next, a first ion implantation 2 is carried out to form an anti-punch doped region 21 below the patterned semiconductor layer 23a. According to another embodiment of the invention, if there is no semiconductor layer 23 covering the substrate 10 before formation of the fin structures 11, the anti-punch doped region 21 will be formed directly inside the fin structure 11. The remaining sequence is similar to FIGS. 6-8 according to the second exemplary embodiment. A detailed description is therefore omitted as this can be ascertained by referring to the previous paragraphs.

The Fourth Exemplary Embodiment

Please refer to FIG. 1 and FIGS. 3-8. The fourth exemplary embodiment is similar to the second exemplary embodiment and the main difference between them is that, in the fourth exemplary embodiment, the time of performing the first ion implantation 2 is at the time interval between the planarization 1c process and the etching back 1d process. Similar to FIGS. 3-5, a substrate 10 covered with a semiconductor layer 23 is provided and there is no anti-punch doped region in the substrate 10. Next, at least a fin structure 11 is formed on the substrate 10 and is separated by a shallow trench 13. Subsequently, as illustrated in FIG. 5, through a high density plasma CVD (HPCVD) process, a sub atmosphere CVD (SACVD) process or a spin on dielectric (SOD) process, an insulation layer 31 covering the fin structures 11 and filling the shallow trenches 13 is formed on the substrate 10. As similar to FIG. 6, a chemical mechanical polishing (CMP) process is then performed to planarize the insulation layer 31 and a first ion implantation 2 is carried out to form an anti-punch doped region below the patterned semiconductor layer 23a. According to another embodiment of the invention, if there is no semiconductor layer 23 covering the substrate 10 before formation of the fin structures 11, the anti-punch doped region 21 will be formed directly inside the fin structure 11. The remaining sequence is similar to FIGS. 6-8 according to the second exemplary embodiment. A detailed description is therefore omitted as this can be ascertained by referring to the previous paragraphs.

The Fifth Exemplary Embodiment

Please refer to FIG. 1 and FIGS. 3-8. The fifth exemplary embodiment is similar to the second exemplary embodiment and the main difference between them is that, in the fifth exemplary embodiment, the time of performing the first ion implantation 2 is at the time interval between the etching back 1d process and removing the second patterned mask layer 29. Similar to FIGS. 3-6, at least a fin structure 11 is formed on the substrate 10 and is separated by a shallow trench 13. Subsequently, an insulation layer 31 covering the fin structures 11 and filling the shallow trenches 13 is formed on the substrate 10. A chemical mechanical polishing (CMP) process is performed to planarize the insulation layer 31 and an etching back process 1c is performed to remove a portion of the insulation layer 31 to form the shallow trench isolation 19 on the substrate 10 between each of the fin structures 11. At this time, there is no anti-punch doped region in the fin structures 10.

Next, still similar to FIG. 6, a first ion implantation 2 is carried out to form an anti-punch doped region 21 below the patterned semiconductor layer 23a. According to another embodiment of the invention, if there is no semiconductor layer 23 covering the substrate 10 before formation of the fin structures 11, the anti-punch doped region 21 will be formed directly inside the fin structures 11. The remaining sequence is similar to FIGS. 7-8 according to the second exemplary embodiment. A detailed description is therefore omitted as this can be ascertained by referring to the previous paragraphs.

The Sixth Exemplary Embodiment

Please refer to FIG. 1 and FIGS. 3-8. The sixth exemplary embodiment is similar to the second exemplary embodiment and the main difference between them is that, in the sixth exemplary embodiment, the time of performing the first ion implantation 2 is after removing a second patterned mask layer 29. Similar to FIGS. 3-6, at least a fin structure 11 is formed on the substrate 10 and is separated by a shallow trench 13. Subsequently, an insulation layer 31 covering the fin structures 11 and filling the shallow trenches 13 is formed on the substrate 10. A chemical mechanical polishing (CMP)

process is performed to planarize the insulation layer 31 and an etching back process 1c is performed to remove a portion of the insulation layer 31 to form the shallow trench isolation 19 on the substrate 10 between each of the fin structures 11. At this time, there is no anti-punch doped region in the fin structures 10.

Next, similar to FIG. 7, an etching process is performed to completely remove the second patterned mask layer 29. Subsequently, a first ion implantation 2 is carried out to form an anti-punch doped region 21 below the patterned semiconductor layer 23a followed by applying an epitaxial growth process, and at least a channel layer 35 covering the surface of the fin structures 11 is formed. Optionally, a second ion implantation which includes a tilted-angle ion implantation may be performed to modulate the doping concentration of the channel layer 35 and further adjust the threshold voltage of transistors. The remaining sequence is similar to FIGS. 7-8 according to the second exemplary embodiment. A detailed description is therefore omitted as this can be ascertained by referring to the previous paragraphs.

Figure 9:
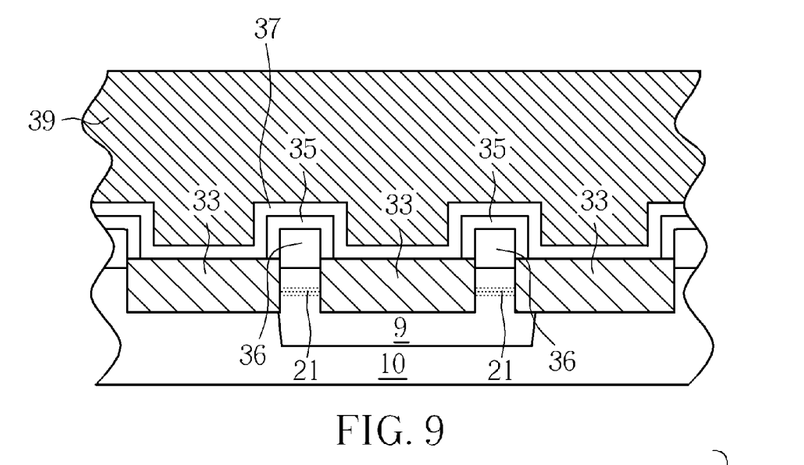

In addition, according to the first exemplary embodiment to the sixth exemplary embodiment, the semiconductor layer 23 with proper stress (tensile or compressive) or with suitable doping concentration is formed on the surface of the substrate. As shown in FIG. 9, however, according to another embodiment, the semiconductor layer 23 dose not exist on the surface of the semiconductor layer 23 and the patterned semiconductor layer 23a is replaced with protruding portions 36, wherein the protruding portions 36 is fabricated by the process of etching the substrate 20. Therefore, the channel layer 35 is disposed along the surface of the protruding portions 36 instead of the patterned semiconductor layer 23a.

The Seventh Exemplary Embodiment

Figure 10:
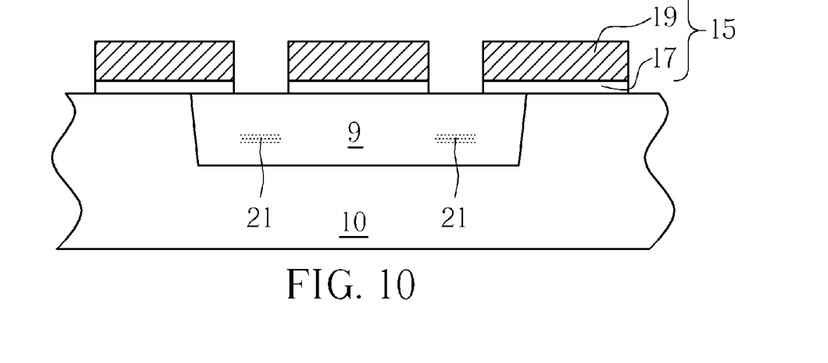

Please refer to FIG. 1 and FIGS. 3-9. The seventh exemplary embodiment is similar to the first exemplary embodiment. The following description focuses on the difference between them. First, as shown in FIG. 10, a substrate 10 covered with a patterned mask layer 15 is provided, wherein the patterned mask layer 15 is used to define the position of anti-punch doped region 21. An ion well 9 with a first conductivity type, e.g. P-type, is formed inside the substrate 10, wherein the ion well 9 has a first doping concentration, e.g. between $10^{12}$ to $10^{13}$ atoms/cm². Besides, another ion well (not shown) with a second conductivity type, e.g. N-type, may be formed inside the substrate 10. The position of the ion wells described above are corresponding to an n-type metal oxide semiconductor transistor (NMOS) region (not shown) and a P-type metal oxide semiconductor transistor (PMOS) region (not shown), respectively. In addition, the patterned mask layer 15 may include a multi-layer structure; for example, may include at least a buffer layer 16, e.g. silicon oxide, and at least a hard mask layer, e.g. silicon nitride.

Still referring to FIG. 10, a first ion implantation 2 is performed to form at least an anti-punch doped region 21 having a third doping concentration higher than the first doping concentration. It should be noted that the first ion implantation 2 may include multiple steps of ion implantation. In addition, according to this embodiment, an oxidation layer 16 may be disposed on the surface of the substrate 10 to prevent severe damages resulting from direct ion bombardment during an ion implantation process. In this embodiment, the patterned mask layer 15 is used to define the anti-punch doped region 21. According to another preferred embodiment, however, the formation of the anti-punch doped region 21 and the formation of the ion well 9 may be in processes with the same photomask, that is to say, the patterned mask layer is not used to define the anti-punch doped region 21.

Figure 11:
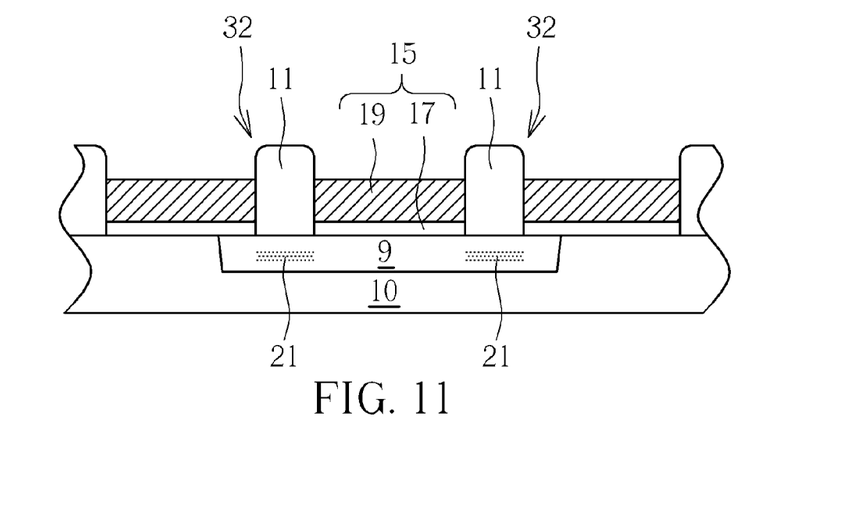

Next, as shown in FIG. 11, by using the exposed surface of the substrate 10 as a seeding layer, at least a fin structure 11 is grown from the bottom of the shallow trench 32 and the top surface of the fin structures 11 protrude from the patterned mask layer 15. The composition of the fin structures 11 includes silicon, silicon germanium, silicon carbide or a combination thereof. It is worth noting that, in this embodiment, a top surface 12 of the fin structure 11 is not covered by a patterned hard mask (not shown), hence, a process of removing a patterned hard mask may be omitted. In addition, according to another embodiment, if the formation of the anti-punch doped region 21 and the ion well 9 is fabricated in processes with the same photomask, another patterned hardmask (not shown) is needed in order to define positions of the fin structures 11. The remaining sequence is similar to FIGS. 4-8 described in the first exemplary embodiment. A detailed description is therefore omitted as this can be ascertained by referring to the previous paragraphs.

In addition, the seventh exemplary embodiment may also apply to the related second exemplary embodiment and fifth exemplary embodiment. It is to say that the time of performing the first ion implantation 2 may be at the following moment: after fin structure formation 1a, after shallow trench insulation (STI) formation 1b, after planarization 1c or after etching back 1d.

Figure 12:
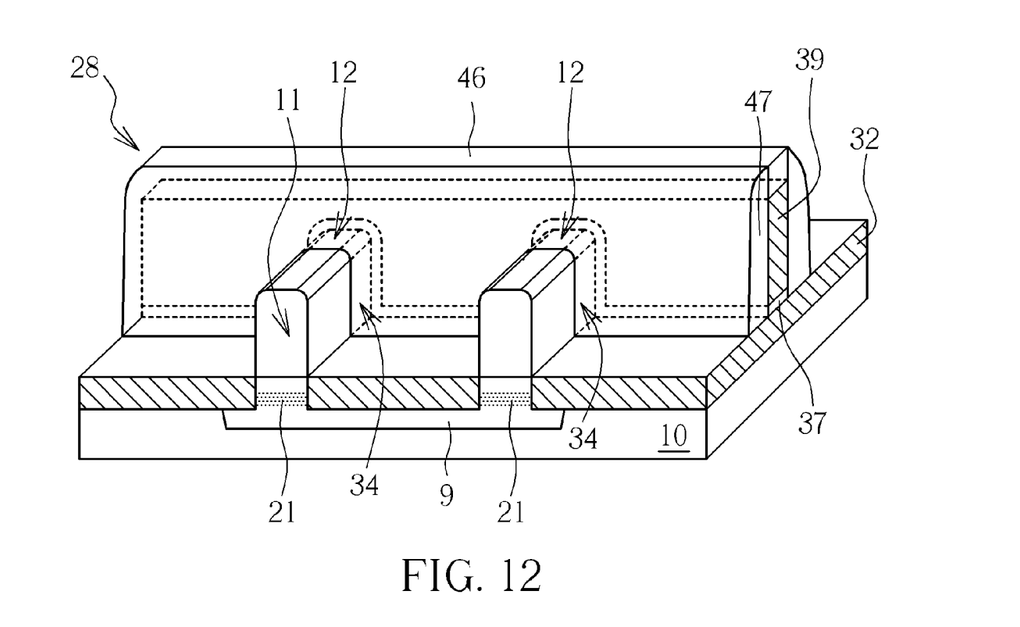

After the processes described in the above-mentioned exemplary embodiments, various semiconductor processes such as MOS process including the polysilicon gate or metal gate are also performed. As shown in FIG. 12, according to one embodiment of the invention, a multi-gate FET with metal gate structure fabricated by a gate-first process is illustrated. First, a patterned cap layer 46 is formed on the gate material layer 39, which comprises metal composition, for defining the position of each of the gates in the NMOS region (not shown) and/or the PMOS region (not shown). The patterned cap layer 46 may serve as a mask layer, as the dielectric layer 37 with high-K composition and the gate material layer 39 are etched to form a plurality of gate structure 28 partially overlapping the fin structures 11. A lightly doped source/drain (not shown) is selectively formed in the fin structure 11 not covered by the gate structure 28. The spacer 47 is formed on the sidewalls of the gate structure 28, where the spacer 47 may be a monolayered structure or multilayered structure or may include a liner, or be a composition thereof. Then, a source/drain region (not shown) is formed in the fin structures 11 at both sides of the gate structure 28 through an ion implantation process by using the spacer 47 and the cap layer 46 as a mask and implanting suitable n-type or p-type dopants. Furthermore, an annealing process could be carried out to activate the source/drain region. Moreover, despite the light doped source/drain region, the spacer 47, and the source/drain region being formed sequentially in this exemplary embodiment, the order of fabricating the spacer and the doped regions could also be adjusted according to the demands of the product; these modifications are all within the scope of the present invention.

Another embodiment of the invention, as similar to FIG. 12, is a method for fabricating a gate-last fin FET. The process for fabricating a gate-last multi-gate FET follows the above-mentioned gate-first process when the gate material 39 depicted in the related FIG. 8 is a polysilicon. In this embodiment, a channel region (not shown) in fin structure 11 is covered with at least a high-K dielectric layer (not shown), at least a work function tuning layer (not shown), and at least a metal conductive layer (not shown). The high-K dielectric layer described in the above gate-first and gate-last processes includes hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or any combination thereof. The metal conductive layer may include a low resistance material such as copper (Cu) or any combination thereof. A barrier layer (not shown) is selectively disposed between the high-k gate dielectric layer and the work function tuning layer and between the work function tuning layer and the metal conductive layer, and the material of the barrier layer may include titanium (Ti), titanium nitride (TiN), tantalum (Ta) or tantalum nitride (TaN).

Still referring to FIG. 12, at this point, a multi-gate MOSFET with fin structure is fabricated via the gate-first or the gate-last process described above. It is worth noting that, in above embodiments, three contact faces between the fin structure 11 and the dielectric layer 23 functions as a carrier channel whose width is wider than a channel width in conventional planar MOSFET. When a driving voltage is applied, the multi-gate MOSFET produces a double on-current comparing to the conventional planar MOSFET. The above-mentioned multi-gate MOSFET, however, is not limited to a tri-gate MOSFET. According to different requirements, a patterned hard mask (not shown) may exist between the top surface 12 of the fin structure 11 and the dielectric layer 37, therefore, only two contact faces exist between the fin structure 11 and the dielectric layer 37. A FET with two such contact faces is called fin field effect transistor (Fin FET)

To summarize, the present invention provides a method for fabricating a FET with fin structure, wherein the time of performing the first ion implantation 2 is earlier than that of the channel layer formation 3. Therefore, the value of carrier mobility in the channel layer 35 and the electrical property of the channel layer 35 would not be affected by the first ion implantation 2, which may reduce the electrical variation among each transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A structure of a field effect transistor with fin structure, comprising:
    a substrate having an ion well with a first conductivity type, wherein the ion well has a first doping concentration;
    at least a fin structure disposed on the substrate;
    at least a channel layer disposed along the surface of the fin structure, wherein the channel layer has a second doping concentration lighter than the first doping concentration, and the channel layer is an epitaxial layer;
    at least an anti-punch doped region with the first conductivity type disposed between the substrate and the channel layer, wherein the anti-punch doped region has a third doping concentration heavier than the first doping concentration;
    a gate covering part of the fin structure; and
    a source and a drain disposed in the fin structure beside the gate, wherein the source and the drain have a second conductivity type.

2. The structure of a field effect transistor with fin structure according to claim 1, wherein an insulation layer disposed on the substrate is in butted contact with the fin structure.

3. The structure of a field effect transistor with fin structure according to claim 1, wherein the distance between the top surface of the fin structure and the anti-punch doped region is smaller than 400 angstrom.

4. The structure of a field effect transistor with fin structure according to claim 1, wherein the highest concentration of the second doping concentration is smaller than $10^{12}$ atoms/cm$^2$.

* * * * *